(12) United States Patent
Audren (10) Patent No.: US 6,268,682 B1
(45) Date of Patent: Jul. 31, 2001

(54) AMPLIFIED ACTIVE-MATERIAL ACTUATORS

(75) Inventor: Jean Thierry Audren, St Rémy les Chevreuse (FR)

(73) Assignee: SFIM Industries, Massy (FR)

( * ) Notice: Subject to any disclaimer, the term of this patent is extended or adjusted under 35 U.S.C. 154(b) by 0 days.

(21) Appl. No.: 09/170,013

(22) Filed: Oct. 13, 1998

(30) Foreign Application Priority Data

Oct. 13, 1997 (FR) ................................... 97 12774
Oct. 13, 1997 (FR) ................................... 97 12775

(51) Int. Cl.⁷ ..................................................... H01L 41/08
(52) U.S. Cl. ......................... 310/333; 310/328; 310/368
(58) Field of Search ..................... 310/357, 333, 310/368, 367, 366, 328

(56) References Cited

U.S. PATENT DOCUMENTS

| | | | |
|---|---|---|---|
| 4,609,845 | * 9/1986 | Soni et al. ............................. | 310/357 |
| 4,629,925 | * 12/1986 | Booth et al. .......................... | 310/330 |
| 5,001,382 | 3/1991 | Umeda et al. ........................ | 310/328 |
| 5,184,037 | * 2/1993 | Kobayashi et al. ..................... | 310/26 |
| 5,245,734 | * 9/1993 | Issartel ............................... | 29/25.35 |
| 5,268,611 | * 12/1993 | Culp ..................................... | 310/328 |
| 5,306,919 | * 4/1994 | Elings et al. ..................... | 250/442.11 |
| 5,306,979 | * 4/1994 | Schwarz, Jr. .......................... | 310/328 |
| 5,323,082 | * 6/1994 | Wright ................................. | 310/328 |
| 5,490,015 | * 2/1996 | Umeyama et al. .................... | 359/824 |
| 5,521,452 | * 5/1996 | Gregg ................................. | 310/309 |
| 5,626,312 | 5/1997 | Head ................................. | 244/75 R |
| 5,637,937 | * 6/1997 | Nakjima ......................... | 310/40 MM |
| 5,639,508 | * 6/1997 | Okawa et al. ....................... | 427/100 |
| 5,656,882 | * 8/1997 | Lazarus et al. ..................... | 310/328 |
| 5,701,043 | * 12/1997 | Razzaghi ............................... | 310/26 |
| 5,739,625 | * 4/1998 | Falcus ................................. | 310/328 |
| 5,757,105 | * 5/1998 | Breitbach et al. .................... | 310/328 |
| 5,802,195 | * 9/1998 | Regan et al. ......................... | 381/190 |
| 5,861,702 | * 1/1999 | Bishop et al. ....................... | 310/330 |
| 5,939,816 | * 8/1999 | Culp ..................................... | 310/328 |
| 6,020,674 | * 2/2000 | Zhang et al. ......................... | 310/333 |

FOREIGN PATENT DOCUMENTS 0 516 175 A2    12/1992   (EP) .............................. H01L/41/09

* cited by examiner

*Primary Examiner*—Thomas M. Dougherty
(74) *Attorney, Agent, or Firm*—McCormick, Paulding & Huber LLP (57) ABSTRACT

An actuator, comprising a plurality of stacks of unit blocks of an active material of the piezoelectric, electrostrictive, or magnetostrictive type, which blocks are distributed so as to form a tubular structure, together with means enabling an electric or magnetic field to be applied to said unit blocks to cause said unit blocks to deform in such a manner that the tubular structure twists.

28 Claims, 8 Drawing Sheets

FIG_1

FIG_2

FIG_3

FIG_4

FIG_5

FIG_6

FIG_7

FIG_8

FIG_13

FIG_14

FIG_15

FIG_16

FIG_17

FIG_18

FIG_19

FIG_20

FIG_21

FIG_22

AMPLIFIED ACTIVE-MATERIAL ACTUATORS

The present invention relates to amplified actuators using active materials of the piezoelectric, electrostrictive, or magnetostrictive type.

BACKGROUND OF THE INVENTION

There are two types of flight control on board aircraft:
primary controls which serve to control the immediate movements of the airplane; these are generally moving surfaces situated at the trailing edges of the wings;
secondary flight controls which serve to trim the aerodynamic configuration of the aircraft to match different stages of flight. This category includes the tail plane and high-lift moving surfaces and tips.

The characteristics required of actuators for such surfaces are very different.

The primary controls must be capable of accommodating a passband that is greater than the spectrum width of the movements that the aircraft can perform, they must be capable of operating at all times, and they must be suitable for returning to a neutral position if there is a loss of power.

In contrast, secondary controls operate intermittently so they need a small passband only, but they must be capable of remaining in the most recent position in the event of a power failure.

These controls are generally implemented as hydraulic devices which, for primary controls, act directly, while for secondary controls they act via mechanical stepdown means. It is the mechanical stepdown means used in the second case that provide the required non-reversibility.

For various reasons (maintenance, pollution, fire risk, etc.) aircraft manufacturers are seeking to reduce the hydraulic contribution in controls and to promote electric control. Unfortunately, the technology of electromagnetic motors associated with stepdown means leads to equipment of excessive mass.

OBJECTS AND SUMMARY OF THE INVENTION

An object of the invention is to propose motors based on piezoelectric, electrostrictive, or magnetostrictive materials that are suitable for presenting high energy densities, that are capable of withstanding high stresses, and that consequently constitute good candidates for primary control.

Proposals have already been made to provide actuators based on vibration motors in which tangential and normal vibration generated on a stator is transformed into continuous motion by mechanical contact friction between the stator and the rotor.

For a general description of applications for that type of motor to secondary flight controls, reference can be made, for example, to:

"Actionneurs—Des matériaux piézoélectriques pour les commandes du futur" [Actuators—piezoelectric materials for future controls], published in Usine Nouvelle, Oct. 31, 1996, No. 2568; and "Des commandes de vol piézoélectriques" [Piezoelectric flight controls], published in Air et Cosmos/Aviation International, No. 1602, Feb. 28, 1997.

Nevertheless, that type of motor is not suitable for use in making primary controls, given that continuous operation leads to the interface wearing too quickly, and to the last-reached position being maintained in the event of a power failure.

Another solution that has also been proposed consists in using piezoelectric displacement directly to achieve a limited amount of movement of a control surface. Since piezoelectric materials are capable of providing very high levels of force but can provide only very small amounts of displacement, it is appropriate to include therein structures which increase displacement so as to make them compatible with the amount of movement required for control surfaces. Such devices are commonly referred to as "amplifiers" even though power input is always greater than power output.

Amplified actuator structures are described, for example in: "A new amplifier piezoelectric actuator for precise positioning and semi-passive damping" by R. Le Letty, F. Claeyssen, G. Thomin, 2nd Space Microdynamics and Accurate Control Symposium, May 13–16, 1997, Toulouse.

In that article, it is proposed to use an elastic mechanical amplifier at the outlet from a piezoelectric actuator. Others have proposed using hydraulic conversion means as an amplifier (cf. above-mentioned article published in Usine Nouvelle).

Nevertheless, those solutions are not satisfactory. The structure that performs the conversion must be more rigid than the basic actuator, otherwise the power delivered by the actuator serves to deform the conversion structure to the detriment of delivering power output. This rigidity is often obtained by using parts that are massive, thereby considerably reducing the initial advantage of lightness and high energy density.

An object of the invention is thus to propose a structure that is rigid and lightweight for converting small driving piezoelectric displacements into large displacements.

To this end, the invention provides an actuator comprising a plurality of stacks of unit blocks of an active material of the piezoelectric, electrostrictive, or magnetostrictive type, which blocks are distributed so as to form a tubular structure, together with means enabling an electric or magnetic field to be applied to said unit blocks to cause said unit blocks to deform in such a manner that the tubular structure twists.

In first variant embodiments, the unit blocks are piezoelectric or electrostrictive, and the means for deforming said blocks comprise means forming electrodes enabling electric fields to be applied to said blocks.

Such an actuator advantageously further includes the various following characteristics taken singly or in any possible combination:

the unit blocks work in elongation/retraction and they are stacked with polarization that alternates in the height direction of the tubular structure;

the stacks are separated in pairs by separator means extending along the height direction of the structure, and the separator elements are constituted by a succession of slabs each being of a height that corresponds at least to the height of two unit blocks, the slabs being suitable for sliding relative to one another and being of stiffness that is greater than that of the unit blocks, the separator zones between superposed slabs at the same height being offset in the height direction of the structure from one separator means to the next in the circumferential direction;

the separator means are constituted by strips presenting a plurality of slots that, in pairs, define the slabs;

the separator means are constituted by a plurality of separator elements which are superposed, each of which constitutes a unit slab;

the electrode-forming means are constituted by the separator means;

the unit blocks operate in shear;

two successive unit blocks in the height direction of a given stack present electrode-forming metallizations on their facing faces;

the stacks of unit blocks are separated by electrically conductive separator means to which the electrode-forming metallizations are connected;

the unit blocks are distributed in washer-like layers in the height direction of the tubular structure;

the actuator includes a prestress envelope in which the tubular structure of unit blocks is placed;

the prestress envelope comprises a plurality of rings each providing prestress to a washer-like layer of unit blocks of the tubular structure;

the rings are electrically conductive and the actuator comprises a plurality of contact areas distributed in the height direction of the structure between the separator means and the prestress rings;

the contact areas are distributed so as to make contact with every other slab;

the rings are separated by electrically insulating washers; and the envelope or the prestress rings is/are made of an alloy having shape memory.

Such an actuator is advantageously made as follows:

a) insulating washers and prestress rings in the low temperature phase are stacked in alternation inside an outer tube;

b) split metal strips are stuck along generator lines of a cylindrical inner core having an insulating surface, adjacent pairs of strips being offset relative to one another in the length direction of said core by half the thickness of the core;

c) the core is inserted together with its strips into the tubular structure constituted by the prestress rings and the washers;

d) the unit blocks are inserted into the housings between the rings, the strips, and the core; and e) the assembly is heated to change the phase of the prestress rings.

In other variant embodiments, the unit blocks of the tubular active structure comprise a plurality of stacks of blocks designed to be deformed by the magnetostrictive effect, with separator means being interposed between the blocks, the separator means being constituted by stacks of separator slabs each being of a height that corresponds at least to the height of two blocks that are to be deformed by the magnetostrictive effect, the various superposed slabs in the height direction of the active structure being suitable for sliding relative to one another, the separation zones between superposed separator slabs at the same height being, from one separation means to another, offset in the height direction of the structure, the actuator further including means for applying a magnetic field to the blocks that are to be deformed by the magnetostrictive effect, thereby causing said blocks to shrink and to lengthen in alternating manner in the height direction of the structure and around it.

Such an actuator advantageously further includes the various following characteristics taken singly or in any possible combination:

the active structure is a tube of magnetostrictive material having a plurality of slots disposed in a staggered configuration and defining between them both zones corresponding to the blocks that are designed to be deformed by the magnetostrictive effect, and zones corresponding to the separator slabs;

the actuator includes means for applying a uniform permanent radial magnetic field to the active structure and for adding to said permanent field a radial control field which alternates from one block that is to be deformed by the magnetostrictive effect to another;

the actuator comprises means for applying a permanent radial field to the active structure that alternates from one block which is designed to be deformed by the magnetostrictive effect to the next, and in adding to said permanent field a radial control field that is uniform;

the actuator has permanent magnets in register with different blocks designed to be deformed by the magnetostrictive effect;

the permanent magnets are of polarization that alternates from open magnet to the next;

the permanent magnets are carried by a core which comprises a plurality of segments suitable for turning relative to one another, and the actuator further includes means for communicating the twisting movement of the active structure to said segments;

said means comprise an axial torsion bar; and said means comprise elastomer links between successive permanent magnets in the height direction of the active structure.

BRIEF DESCRIPTION OF THE DRAWINGS

The following description is purely illustrative and non-limiting. It should be read with reference to the accompanying drawings, in which.

MORE DETAILED DESCRIPTION

Figure 1:
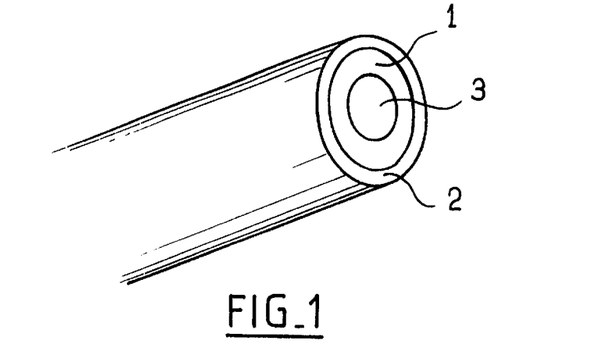
FIG. 1 is a diagrammatic perspective view of an actuator constituting one possible embodiment of the invention.

The actuator constituting one possible embodiment as shown in FIG. 1 is cylindrical in shape and comprises a tubular active structure 1 together with a prestress envelope 2 in which the active structure 1 is mounted. It also optionally includes a central core 3 which serves mainly during construction of the actuator, and which can be withdrawn at the end of manufacture, where appropriate, and as explained in greater detail below.

The cylindrical actuator takes on a large amount of twisting motion about its axis of symmetry when a control voltage is applied to its prestress envelope. With the active structures 1 described below, this twisting can be as much as 0.25 radians, i.e. 15°.

Figure 2:
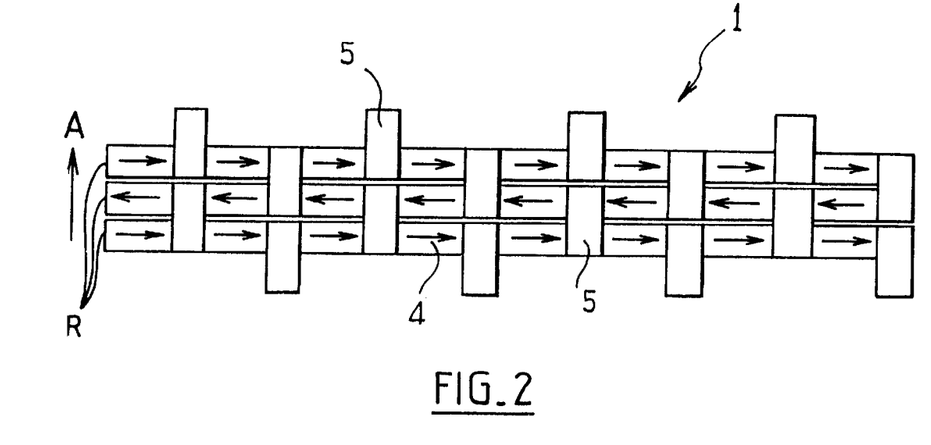
FIG. 2 is a developed view of the active structure of the FIG. 1 actuator.

FIG. 2 shows in developed form, a small amount of an active structure 1 constituting one possible embodiment.

The axis A represents the direction of the axis of the cylinder.

Rectangles having respective arrows drawn in their middles represent blocks of piezoelectric or electrostrictive material and they are referenced 4.

These blocks 4 are either solid ceramic blocks, or else multilayer blocks. If they are ceramic blocks, the direction of the arrow corresponds to the orientation of their polarization. If they are multilayer blocks, the direction of the arrow corresponds to the orientation of the polarization of their extreme layers.

The blocks 4 are stacked in the long direction of the structure and each layer of the stack is constituted by a plurality of blocks 4 which are juxtaposed so as to form a closed annulus, thereby constituting a washer R.

In a given stack layer, successive blocks 4 are separated in pairs by inert separator elements 5 (slabs) each extending through two layers of the stack. These separator elements are made of higher stiffness materials than the ceramic of the blocks 4. They may be made of steel, for example.

Successive separator elements 5 in any given layer of the stack project alternately into each of the two layers of the stack on either side of the stack layer in question, and they constitute separator elements for blocks 4 in each of the two layers concerned.

Two successive separator elements 5 in the axial direction of the structure are in contact with each other, but are suitable for moving relative to each other.

The polarization directions of the blocks 4 (or of their outer layers if they are made of multilayer material) alternate from one stack layer to the next.

If an alternating voltage (+V, −V) is applied to alignments along the axis A of separator elements 5, then each layer is caused to be shifted relative to its neighbor. Because of the alternating fields in respective washer-like layers R and the alternating polarization of one washer-like layer R to the next, shifting is always in the same direction.

Figure 3:
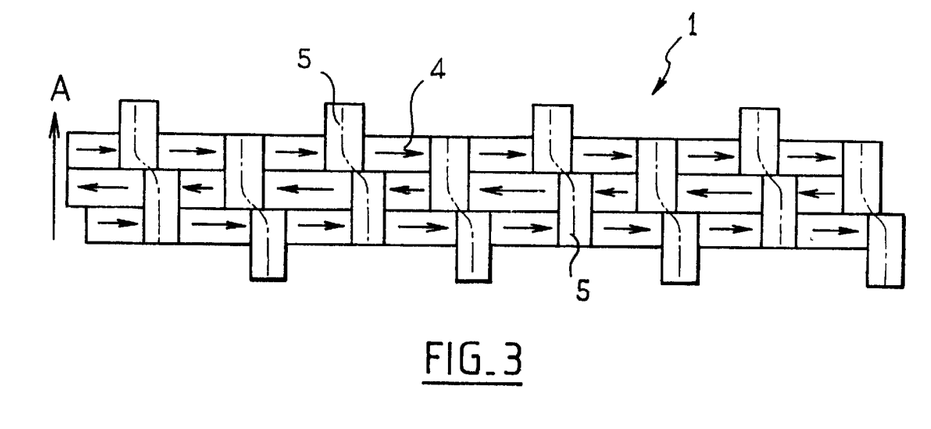
FIG. 3 is a view similar to FIG. 2 showing how the active structure operates.

This is shown in FIG. 3.

Assuming that the deformation of the material constituting the separator elements 5 (metal) is negligible relative to the deformation of the ceramic constituting the blocks 4 (a large difference in Young's modulus), and assuming that the elements 5 move while remaining parallel to their initial directions, then to a first approximation:

$$\theta = 2\pi\mu\epsilon . m/n$$

$$K = (E/2\pi\mu)(n^2/m^2)R.\Delta R.\underline{l}$$

where:

$\theta$ = maximum twist of the shaft under an applied voltage;

m = the number of layers in the cylinder;

$\epsilon$ = the maximum relative deformation of the ceramic under an applied field;

$\mu$ = the ratio of ceramic volume p to the total volume of metal+ceramic;

R = the outside radius of the active structure;

K = the torsional stiffness of the shaft;

n = the number of ceramic blocks in a washer;

E = Young's modulus of the ceramic;

$\Delta R$ = the difference between the outside radius and the inside radius of the active layer; and $\underline{l}$ = length of the actuator.

Using these two formulae, it is possible to select the characteristics that are desired for the shaft constituted by the cylindrical actuator. It can be seen that ratio $\mu$m/n represents the mechanical amplification coefficient. To have a large ratio, it is desirable to have a large number of layers with as small a number as possible of blocks per layer.

The ratio $\mu$ must also be high, but it needs to remain smaller than 0.5. As this ratio increased, the metal separator elements 5 are subjected to twisting motion that is prejudicial to operation of the device.

To be able to increase $\mu$ while avoiding this phenomenon as much as possible, it is advantageous to replace the individual separator elements 5 by separator elements constituted by strips 6, e.g. metal strips, extending parallel to the axis A of the cylinder and having slots 7 formed therein.

Figure 4:
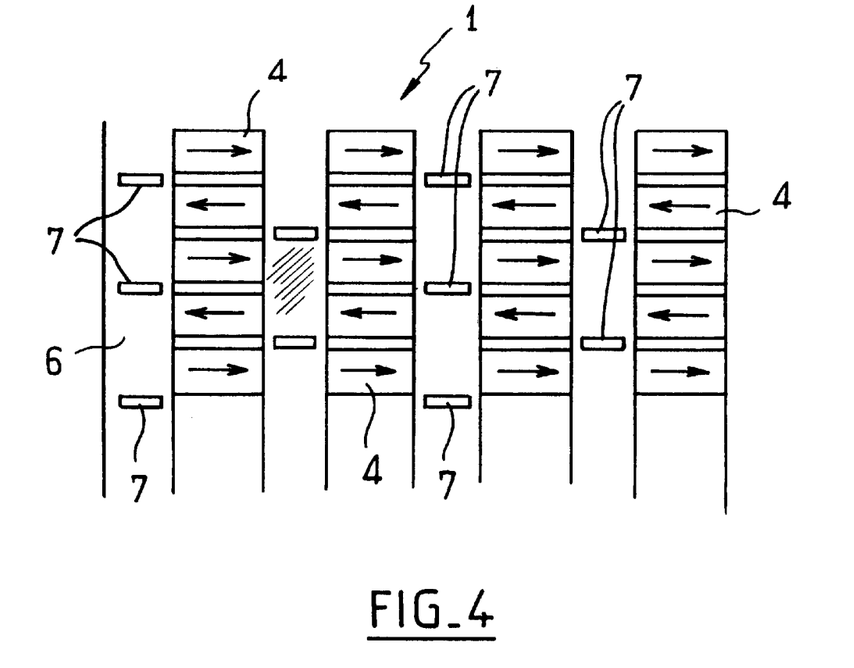
FIG. 4 is a developed view of another possible variant implementation of the active structure.

A variant on these lines is shown in FIG. 4.

The slots 7 of the strip 6 are spaced apart by a distance which corresponds to the height of two successive layers of blocks 4.

From one strip to the next, the slots 7 are offset by the height of one layer of blocks 4.

With such a structure, the mass of metal (slab) between two successive slots 7 in a strip represents the equivalent of a separator element 5 in the structure described with reference to FIGS. 2 and 3, and said slots 7 simulate the links between the separator element 5 that enable one element 5 to slip relative to another while limiting tilting.

Figure 5:
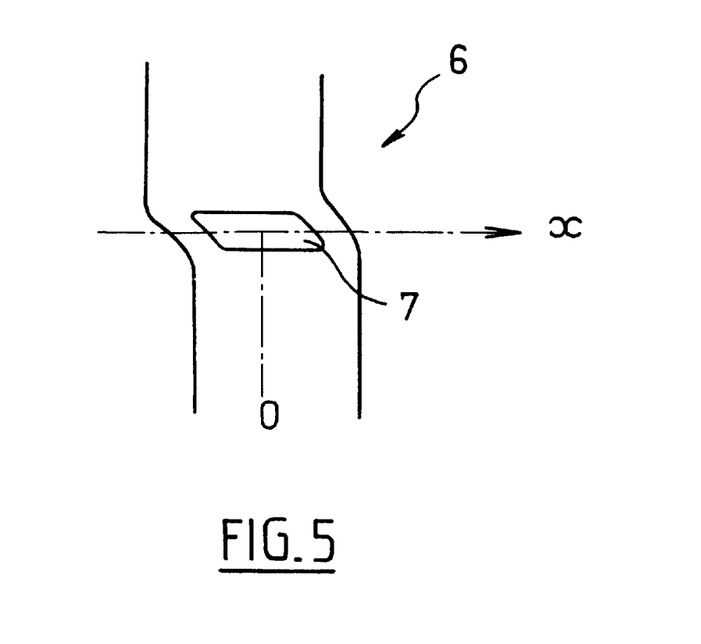
FIG. 5 shows the slip between two slabs of the separation means in the FIG. 4 structure.

The deformation of a zone of a strip 6 about a slot 7 is shown in FIG. 5.

It will be observed that the slots 7 eliminate a large fraction of the shear stresses which are uniformly distributed in the surface during translation, and maximize traction/compression stresses which are large on the edges of the separator elements 5 during tilting.

Figure 6:
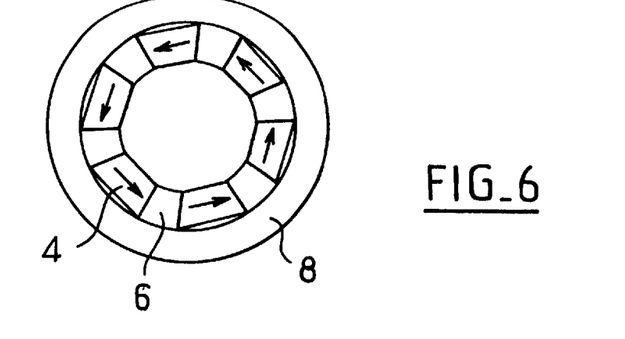
FIG. 6 is a cross-section view of the FIG. 1 actuator.

The prestress envelope 2 is made for each layer of the cylinder by means of a prestress ring 8 which is clamped against the metal/ceramic assembly in the manner shown in FIG. 6.

The prestress rings 8 are advantageously made of an alloy having shape memory with high temperature hysteresis, e.g. an alloy of the Ni—Ti—Nb type. In the low temperature phase obtained by quenching in liquid nitrogen, the ring 8 has an inside diameter at ordinary temperature that is sufficient to enable the alternating ceramic-metal structure to be constructed. By heating to above 150° C., the ring 8 takes on its high temperature structure by shrinking, thereby providing prestress. It retains this structure even on returning to ordinary temperatures of use (−60° C. to +100° C.).

To avoid short circuits between the +V and −V power supply circuits, only every other strip 6 (or every other separator element 5) is in contact with the ring 8.

Contact is preferably provided by contact areas 10.

Figure 7:
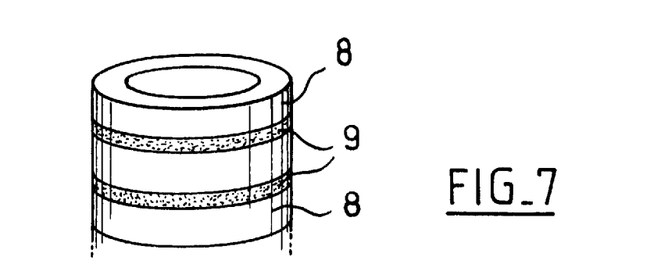
FIG. 7 is a diagrammatic perspective view showing one possible embodiment of the prestress envelope.

To make the prestress uniform, the distribution of contact areas is caused to alternate from one layer to the next. This has the result that each prestress ring 8 is at a potential opposite that of its immediate neighbors. It is therefore appropriate, as shown in FIG. 7, to interpose electrically insulating washers 9 between the prestress rings 8.

Figure 8:
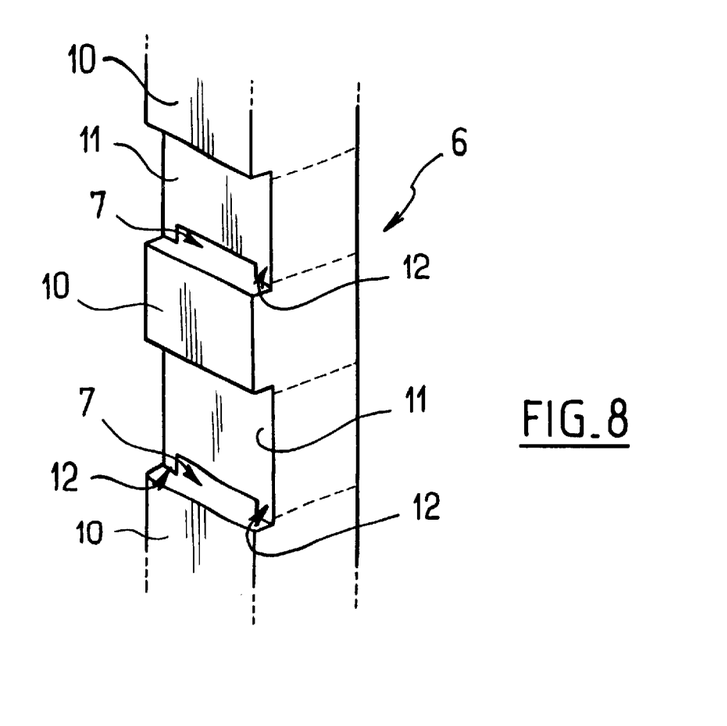
FIG. 8 is a perspective view showing a possible embodiment of the separation means.

An example of a possible structure for a separator strip 6 is shown in FIG. 8.

The strip 6 shown in this figure comprises a succession of protrusions forming contact areas 10 alternating with depressions 11, each area 10 and depression 11 corresponding to one layer of the active structure 1.

This solution is preferred because it provides good electrical continuity and it enables prestress to be transmitted from one layer to another by the margins or lateral blades 12 which extend along the strips 6 on either side of the slots. Thus, even those zones of the strips 6 which correspond to the depressions 11 and which are not in contact with the prestress rings 8 of the corresponding layer are held in place by the rings 8 of the immediately adjacent layers.

Another advantage of this solution is good electrical continuity.

Figure 9A:
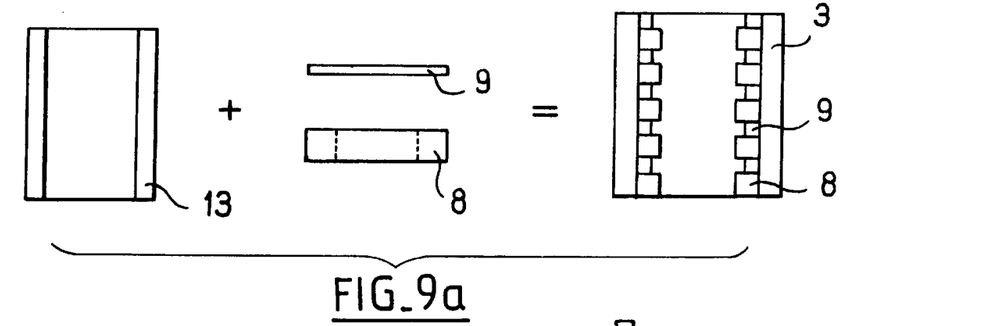
FIGS. 9a to 9c are diagrams showing different steps in making the FIG. 1 actuator.
Figure 9B:
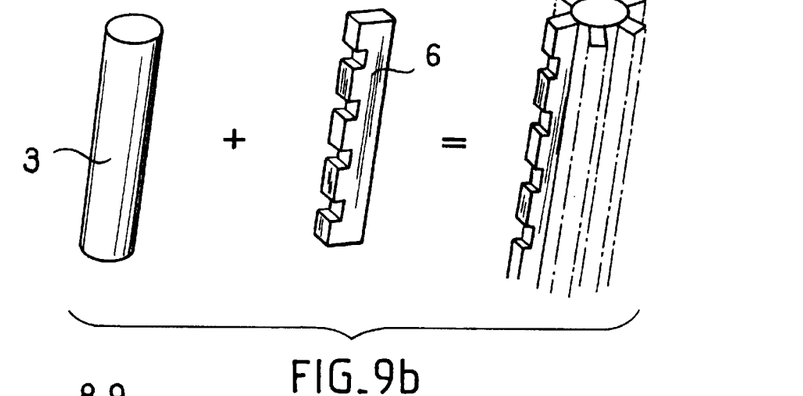
Figure 9C:
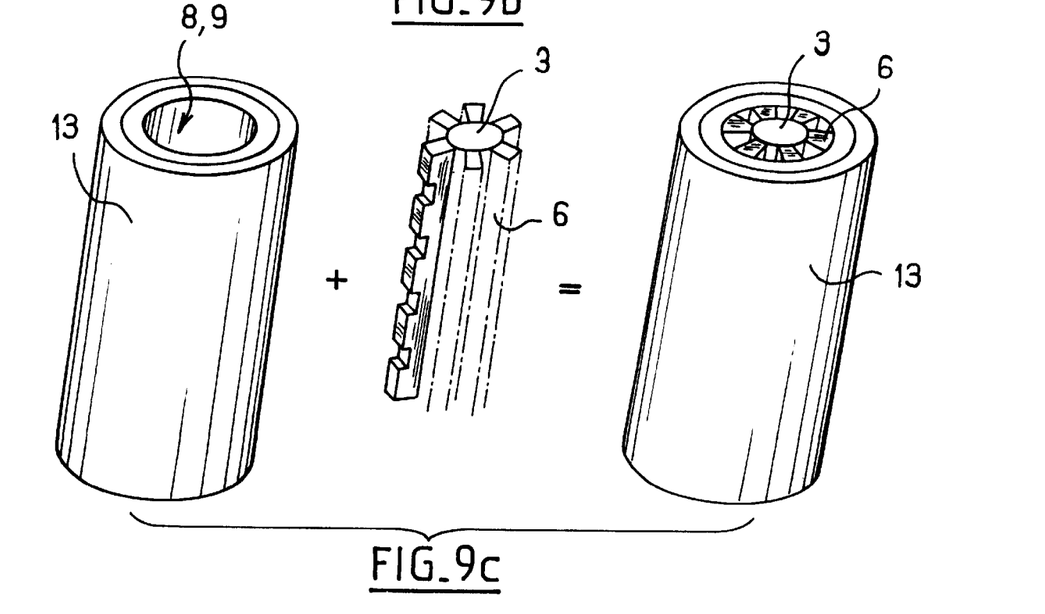

Advantageously, the above-described structure is made as follows (FIGS. 9*a* to 9*c*):

a. An outer tube 13 is taken and prestress rings 8 in the low temperature state are stacked therein in alternation with insulating washers 9 (FIG. 9*a*).

b. On an internal cylindrical core 3 having an insulating surface, split metal strips 6 are stuck temporarily or otherwise along generator lines thereof. These strips are offset along their generator lines by the thickness of one layer (FIG. 9*b*).

c. The core and its strips are inserted into the tube constituted by the prestress washers (FIG. 9*c*).

d. In the housings that remain between the rings 8, the strips 6, and the core 3, ceramic blocks are inserted so that the orthoradial orientation of the polarization thereof is the same in each layer of the stack made in this way and alternates from one layer to the next.

e. The assembly or the outside thereof is heated so as to cause the prestress rings 8 to change phase. The temperature to which the rings are raised must be lower than the Curie temperature of the ceramic blocks so as to avoid depolarizing them.

f. Depending on subsequent use, the outer tube 13 and/or the inner core 3 are optionally removed. If the inner core is left in place, it must present stiffness that is much lower than that of the active structure, either because of its own flexibility or because of the flexibility of its insulating layer. The center of the core 3 may have a rod enabling axial prestress to be applied.

Naturally other variant embodiments are also possible.

In particular, in the description above, it has been implicitly assumed that the blocks 9 are made of ceramic that lengthens or retracts (piezoelectric deformation coefficients D33 or D31).

Nevertheless, it is also possible to envisage ceramics that operate in shear (coefficient D15).

Piezoelectric ceramics of this type are now available in the form of solid ceramics.

Given that voltages of several tens of volts can be used for flight actuators, it is possible to envisage using such ceramics.

Figure 10:
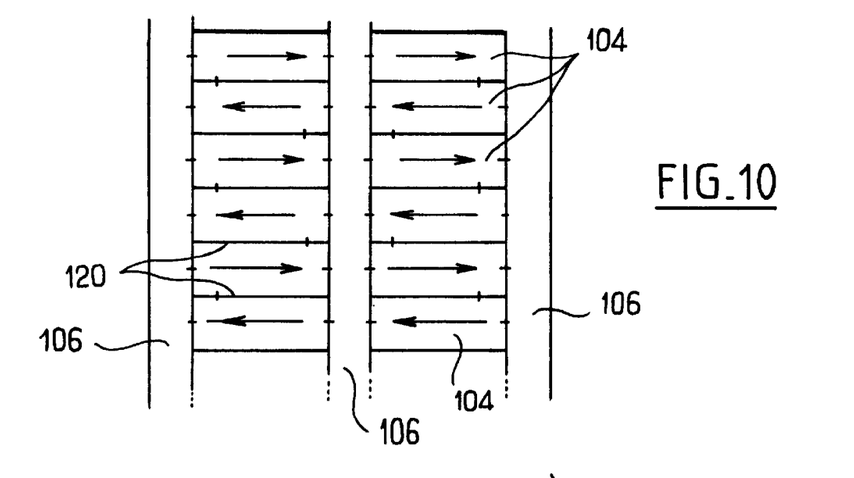
FIGS. 10 and 11 are views similar to those of FIGS. 2 and 3 showing another possible embodiment of the invention.
Figure 11:
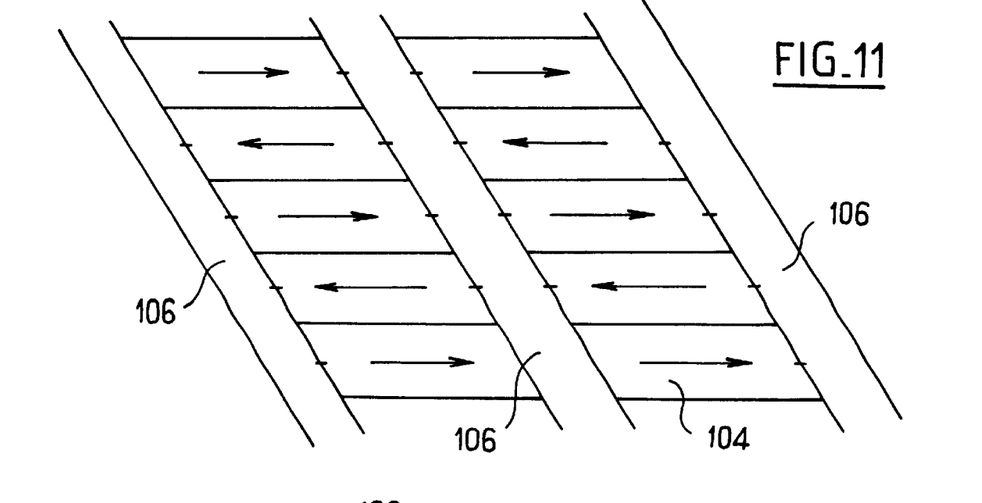
Figure 12:
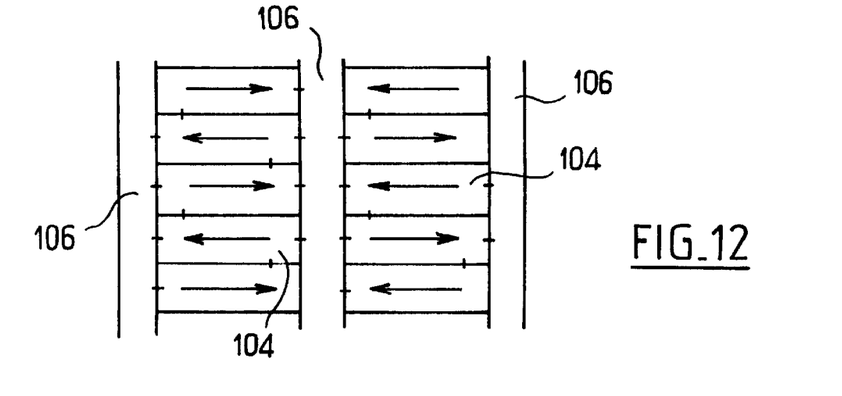
FIG. 12 is a view similar to that of FIG. 10 showing another possible variant embodiment.

FIGS. 10 and 11 show an actuator structure of the invention in which the blocks referenced 104 are made of piezoelectric material that operates in shear.

The blocks 104 are stacked along the height of the structure (along its axis A) with alternating polarization.

Two successive blocks 104 in the same stack are separated by electrode-forming metallization 120, successive layers of metallization 120 in the height direction of the active structure being connected alternately to conductive separator strips 106 disposed on one side and the other side of the stack.

Thus, by applying potentials of +V and −V to alternate separator elements 106, the structure is deformed in the manner shown in FIG. 11.

In the example shown in FIGS. 10 and 11, the blocks 104 in a given layer in the height direction of the structure have same-direction polarization and, in the developed view, the blades 120 are distributed in symmetrical manner on either side of the separator elements 106.

Nevertheless, it is not essential for all of the blocks 104 in a given layer of the stack to be polarized in the same way. Within a layer, polarization can alternate from one block 104 to the next, with the metallization 120 of two successive blocks 104 in the same layer then being connected to two different separator elements 106.

Figure 13:
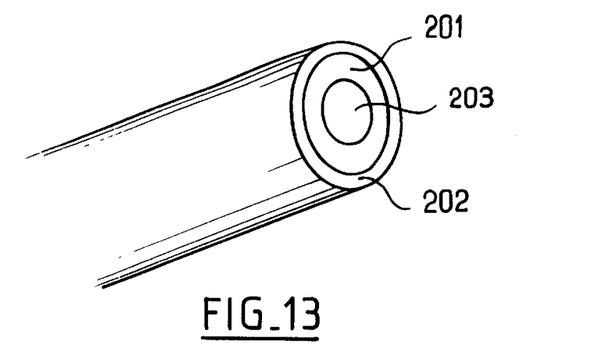
FIG. 13 is a diagrammatic perspective view similar to that of FIG. 1 showing a magnetostrictive actuator constituting another possible variant embodiment.

The magnetostrictive actuator constituting a possible embodiment and shown in FIG. 13 is cylindrical in shape and comprises a tubular active structure 201 together with an envelope 202 in which the active structure 201 is mounted, and a central core 203.

Figure 14:
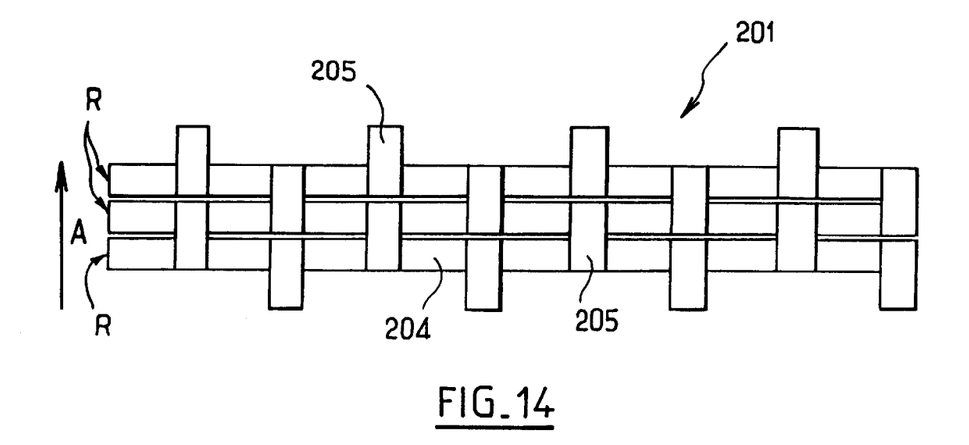
FIG. 14 is a developed view of the active structure of the FIG. 13 actuator.
Figure 15:
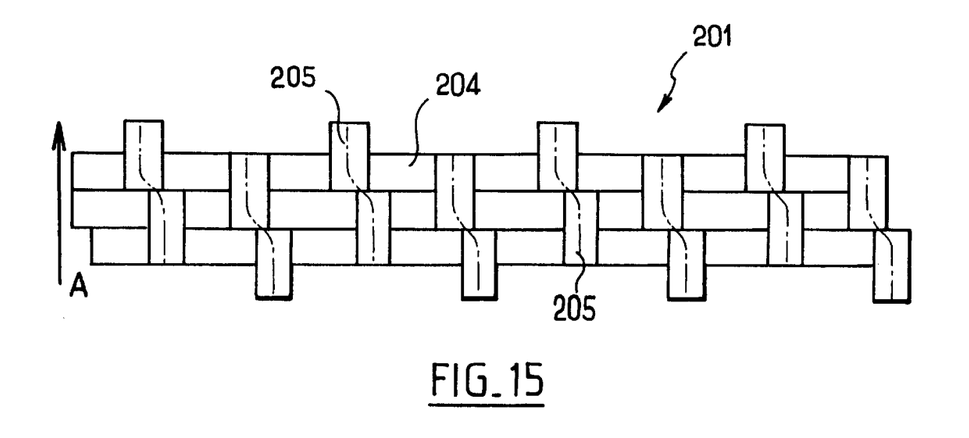
FIG. 15 is a view similar to FIG. 14 showing the twisting movement of the active structure.

FIG. 14 is a developed view showing a small fraction of the height of an active structure 201 constituting one possible embodiment.

The axis A represents the direction of the axis of the cylinder.

This active structure comprises a plurality of blocks 204 of magnetostrictive ceramic which are stacked in the height direction of the structure, each layer of the stack being made up of a plurality of blocks 204 which are juxtaposed so as to form a closed loop and thus constitute a washer-like layer R.

In any one layer of the stack, successive blocks 204 are spaced apart in pairs by inert separator elements 205 (metal slabs) each of which extends through two layers of the stack. These separator elements are made of materials that are much stiffer than the ceramic of the blocks 204, and may be made of steel, for example.

Successive separator elements 205 in a layer of the stack extend in alternation into each of the two adjacent layers of the stack on either side of the layer in question, and thus also constitute separator elements for blocks 204 in one or other said two adjacent layers.

Two successive separator elements 205 in the axial height direction of the structure come into contact with each other, but are suitable for being shifted relative to each other.

Radial magnetic fields are applied to the blocks 204 such that the blocks 204 in a given layer are deformed so that two successive blocks in the same layer or two successive blocks in the height direction of the structure comprise one block that shrinks and another that lengthens, thereby causing each layer to be offset relative to its neighbor and causing the active structure 201 to twist.

This is shown in FIG. 14. The (metal) separator elements 205 are made of a material that is selected to deform by a negligible extent compared with that of the ceramic of the blocks 204 (a large difference in Young's modulus).

Figure 16:
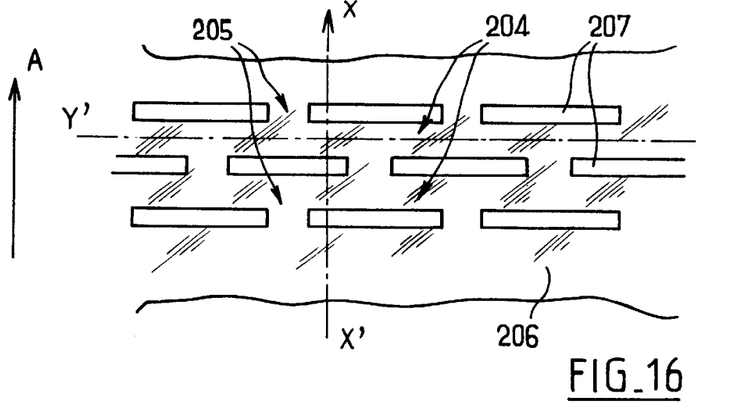
FIG. 16 is a view similar to that of FIG. 14 showing another possible embodiment of the invention.

It is also possible to provide for the separator strips to be integral with the blocks 204, in which case an active structure is obtained that is of the type shown in FIG. 16, constituted by a tube 206 and a magnetostrictive material having a plurality of slots 207 distributed in a staggered configuration, the zones corresponding to the slabs 205 being defined between the slots 207 lying on a common generator line in the height direction of the structure, while the zones that produce the magnetostriction effects when a radial magnetic field is applied and that correspond to the blocks 204 (shaded zones in FIG. 16) are zones defined between the portions which overlap the slots 207 situated at two successive height levels along the structure.

Since magnetostriction is an even phenomenon, i.e. since it does not depend on the sign of the field (cf. FIG. 17), it is appropriate to apply a bias magnetic field so that each zone presents an alternating mechanical effect both along the axis of the cylinder and in an orthoradial direction.

Figure 17:
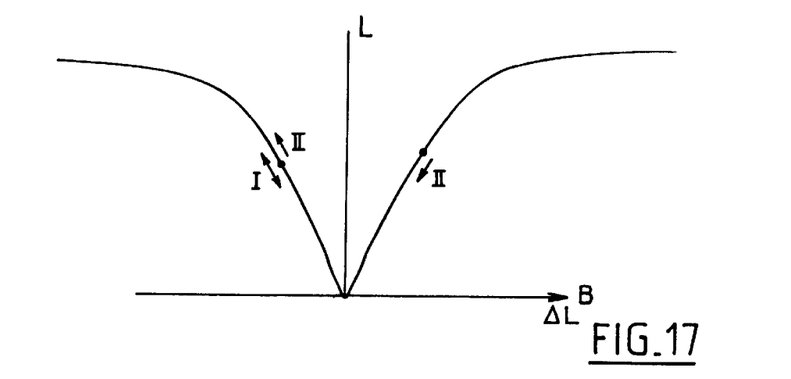
FIG. 17 is a graph in which elongation L of a magnetostrictive material is plotted as a function of the magnetic field B which is applied thereto.

There are then two possibilities:
either a uniform permanent radial magnetic field can be applied over the entire cylinder and a radial control field can be added thereto in alternation from one zone to the next (double-headed arrow I in FIG. 17);
or else a permanent radial field can be applied that alternates from one zone to the next, and a uniform radial control field can be added thereto for control purposes (single-headed arrows II in FIG. 17).

Figure 18:
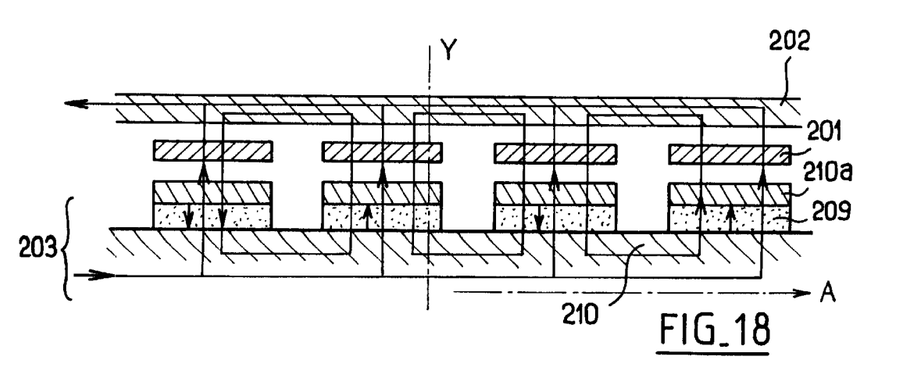
FIG. 18 is a half-view in the radial section of the actuator of FIG. 15.

A structure corresponding to the second possibility is shown in FIG. 18 and is described in detail below.

Nevertheless, it is also possible to devise intermediate structures in which the permanent radial field is not constant but alternates over zones of larger size, with the alternation in the control field then being offset on passing from one zone to the next.

Another intermediate structure would consist in a structure having a radial control field that alternates over large zones, with alternations in the permanent field being offset on the transitions from one zone to the next.

The structure shown in FIG. 18 is shown in radial half-section.

The envelope 202 therein is made of a soft magnetic material, e.g. a metal.

The core 203 is constituted therein by a rod 210 of a soft magnetic material (metal) carrying a plurality of magnets 209 in register with the zones (blocks) 204. These magnets 209 are polarized in the manner that alternates both in the height direction and circumferentially relative to the rod 210.

By way of example, these magnets are interposed between said rods 210 and elements 210a of soft magnetic material in register with the active structure 201.

Figure 19:
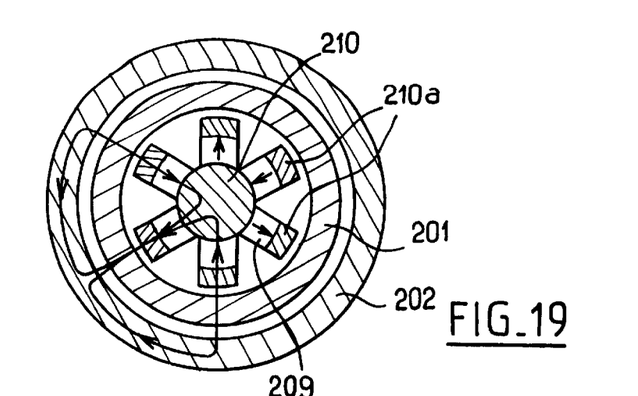
FIG. 19 is a cross-section view of the same actuator.

The alternating polarization of the magnets 209 gives rise to alternative permanent magnetic fields in the magnetostrictive material. As shown in FIG. 19, this alternation also takes place in the orthoradial direction.

At the end of the core 203 there is a control coil which injects an axial field which is looped back via the outer envelope.

Figure 20:
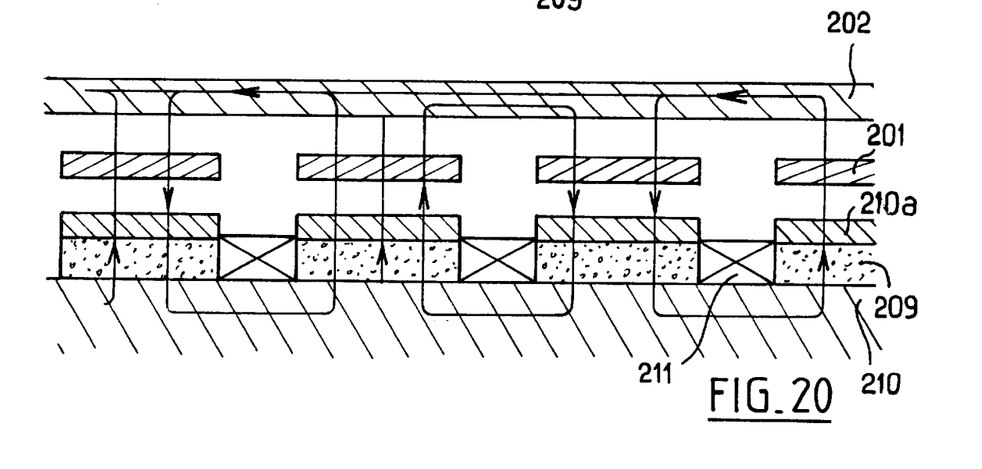
FIG. 20 is a view similar to FIG. 17 showing another embodiment of the invention.
Figure 21:
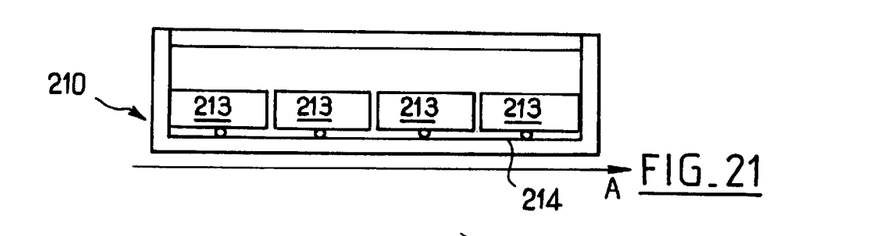
FIGS. 21 and 22 show two possible types of structure for the rod of the structure shown in FIG. 18 or in FIG. 20.

The control field closes in uniform manner through the magnetostrictive material providing the reluctance of the core 203 and of the closure are low compared with the reluctance of the air gap. This is not necessarily the case for a cylinder that is very long. Under such circumstances, and as shown in FIG. 20, it can be necessary to cause the control field to alternate in direction by placing control coils 211 at regular intervals along the rod 210. This reduces the reluctance as seen by each coil.

It will be observed that the structure as described above is particularly advantageous given that the constant field is closed orthoradially in the closure because of the orthoradial alternation of the polarization of the permanent magnets. The device is not sensitive to length.

Nevertheless, when the active structure twists along the axis of the cylinder, the poles of the core are no longer in register with the zones 204 that they ought to be exciting. It is therefore appropriate for the core 203 to be capable of twisting by an amount equal to the twist of the active structure 201, while nevertheless being of much lower stiffness. For this purpose, the core 203 must be secured to the active structure 201 at its ends.

To this end, the rod 210 is advantageously made up of a plurality of segments 213 interconnected by an axial torsion bar 214 of small diameter if it is made of metal or of larger diameter if it is made of elastomer. This is shown in FIG. 1 (in axial half-section) where the dots represent points of connection between the elements of the core and the torsion bar.

Figure 22:
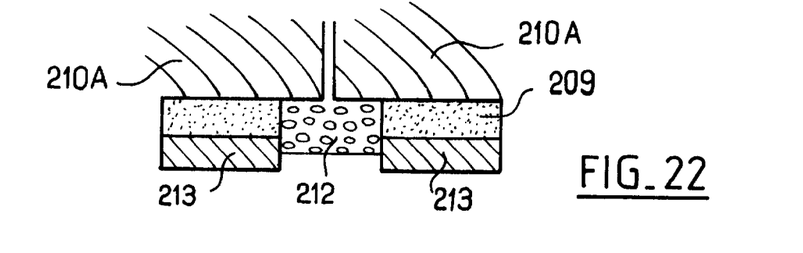

It is also possible to make a connection between two elements 210a of the core via washers 212 of elastomer placed between the various pole layers.

This is shown in FIG. 22.

These elastomer washers 212 can also cover the control coil.

What is claimed is:

1. An actuator, comprising a plurality of stacks of unit blocks of an active material, wherein the active material is piezoelectric, electrostrictive, or magnetostrictive, which blocks are distributed so as to form a tubular structure, together with means enabling an electric or magnetic field to be applied to said unit blocks to cause said unit blocks to deform in such a manner that the tubular structure twists.

2. An actuator according to claim 1, wherein the unit blocks are piezoelectric or electrostrictive, and wherein the means for deforming said blocks comprise means forming electrodes enabling electric fields to be applied to said blocks.

3. An actuator according to claim 2, wherein the unit blocks work in elongation or retraction and wherein they are stacked with polarization that alternates in the height direction of the tubular structure.

4. An actuator according to claim 3, wherein the stacks are separated in pairs by separator means extending along the height direction of the structure, and wherein a plurality of separator elements are constituted by a succession of slabs each being of a height that corresponds at least to the height of two unit blocks, the slabs being suitable for sliding relative to one another and being of stiffness that is greater than that of the unit blocks, the separator zones between superposed slabs at the same height being offset in the height direction of the structure from one separator means to the next in the circumferential direction.

5. An actuator according to claim 4, wherein the separator means are constituted by strips presenting a plurality of slots that, in pairs, define the slabs.

6. An actuator according to claim 4, wherein the separator means are constituted by a plurality of separator elements which are superposed, each of which constitutes a unit slab.

7. An actuator according to claim 4, wherein the electrode-forming means are constituted by the separator means.

8. An actuator according to claim 2, wherein the unit blocks operate in shear.

9. An actuator according to claim 8, wherein two successive unit blocks in the height direction of a given stack present electrode-forming metallizations on their facing faces.

10. An actuator according to claim 9, wherein the stacks of unit blocks are separated by electrically conductive separator means to which the electrode-forming metallizations are connected.

11. An actuator according to claim 1, wherein the unit blocks are distributed in washer-like layers in the height direction of the tubular structure.

12. An actuator according to claim 1, including a prestress envelope in which the tubular structure of unit blocks is placed.

13. An actuator according to claim 12, wherein the unit blocks are distributed in washer-like layers in the height direction of the tubular structure, and wherein the prestress envelope comprises a plurality of prestress rings each providing prestress to a washer of unit blocks of the tubular structure.

14. An actuator according to claim 13, wherein the rings are electrically conductive and wherein the actuator comprises a plurality of contact areas distributed in the height direction of the tubular structure between a separator means and the prestress rings.

15. An actuator according to claim 14, wherein the separator means are constituted by strips presenting a plurality of slots that, in pairs, define the slabs, and wherein the contact areas are distributed so as to make contact with every other slab.

16. An actuator according to claim 14, wherein the rings are separated by electrically insulating washers.

17. An actuator according to claim 13, wherein the envelope or is the prestress rings are made of an alloy having shape memory.

18. A method of making an actuator according to claim 16, wherein the envelope is or the prestress rings are made of an alloy having shape memory, and wherein:
   a) insulating washers and prestress rings in a low temperature phase are stacked in alternation inside an outer tube;
   b) split metal strips are stuck along generator lines of a cylindrical inner core having an insulating surface, adjacent pairs of strips being offset relative to one another in the length direction of said core by half the thickness of the core;
   c) the core is inserted together with its strips into the tubular structure constituted by the prestress rings and the washers;
   d) the unit blocks are inserted into the housings between the rings, the strips, and the core; and
   e) the assembly is heated to change the phase of the prestress rings.

19. An actuator according to claim 1, wherein the unit blocks of the tubular structure comprise a plurality of stacks of blocks designed to be deformed by the magnetostrictive effect, with separator means being interposed between the blocks, the separator means being constituted by stacks of separator slabs each being of a height that corresponds at least to the height of two blocks that are to be deformed by the magnetostrictive effect, the various superposed slabs in the height direction of the tubular structure being suitable for sliding relative to one another, the separation zones between superposed separator slabs at the same height being, from one separation means to another, offset in the height direction of the structure, the actuator further including means for applying a magnetic field to the blocks that are to be deformed by the magnetostrictive effect, thereby causing said blocks to shrink and to lengthen in alternating manner in the height direction of the structure and in the annular direction of the structure.

20. An actuator according to claim 19, wherein the active structure is a tube of magnetostrictive material having a plurality of slots disposed in a staggered configuration and defining between them both zones corresponding to the blocks that are designed to be deformed by the magnetostrictive effect, and zones corresponding to the separator slabs.

21. An actuator according to claim 19, including means for applying a uniform permanent radial magnetic field to the active structure and for adding to said permanent field a radial control field which alternates from one block that is to be deformed by the magnetostrictive effect to another.

22. An actuator according to claim 19, comprising means for applying a permanent radial field to the tubular structure that alternates from one block which is designed to be deformed by the magnetostrictive effect to the next, and in adding to said permanent field a radial control field that is uniform.

23. An actuator according to claim 19, having permanent magnets in register with the blocks designed to be deformed by the magnetostrictive effect.

24. An actuator according to claim 22, having permanent magnets in register with the blocks designed to be deformed by the magnetostrictive effect, and wherein the permanent magnets are of polarization that alternates from one magnet to the next.

25. An actuator according to claim 23, wherein the permanent magnets are carried by a core which comprises a plurality of segments suitable for turning relative to one another, and the actuator further including means for communicating the twisting movement of the active structure to said segments.

26. An actuator according to claim 25, wherein said means for communicating the twisting movement of the active structure to said segments comprises an axial torsion bar.

27. An actuator according to claim 25, wherein said means comprise elastomer links between successive permanent magnets in the height direction of the tubular structure.

28. An actuator, comprising a plurality of stacks of unit blocks of an active material, wherein the active material is piexzoelectric, electrostrictive, or magnetostrictive, which blocks are distributed so as to form a tubular structure, together with means enabling an electric or magnetic field to be applied to said unit block to cause said unit blocks to deform in such a manner that the tubular structure twists, and wherein said unit blocks are distributed in washer-like layers in the height direction of the tubular structure.

* * * * *